(12) United States Patent
Shin et al.

(10) Patent No.: US 7,046,435 B2
(45) Date of Patent: May 16, 2006

(54) REFLECTIVE SEMICONDUCTOR OPTICAL AMPLIFIER

(75) Inventors: Hyun-Cheol Shin, Suwon-si (KR); Jeong-Seok Lee, Anyang-si (KR); Ho-In Kim, Yongin-si (KR); In-Kuk Yun, Suwon-si (KR); Seung-Woo Kim, Anyang-si (KR); Seong-Taek Hwang, Pyeongtaek-si (KR)

(73) Assignee: Samsung Electronics CO LTD, Suwon-si (KR)

( * ) Notice: Subject to any disclaimer, the term of this patent is extended or adjusted under 35 U.S.C. 154(b) by 0 days.

(21) Appl. No.: 10/937,625

(22) Filed: Sep. 9, 2004

(65) Prior Publication Data

US 2005/0185264 A1   Aug. 25, 2005

(30) Foreign Application Priority Data

Feb. 19, 2004   (KR) ...................... 10-2004-0011157

(51) Int. Cl.
*H01S 3/00* (2006.01)
(52) U.S. Cl. .................................... 359/344
(58) Field of Classification Search ............... 359/344; 372/50.1, 50.22
See application file for complete search history.

(56) References Cited

U.S. PATENT DOCUMENTS 6,052,222 A * 4/2000 Kitamura ................... 359/344
6,556,344 B1 * 4/2003 Koren ..................... 359/341.4

FOREIGN PATENT DOCUMENTS

JP         410098231 A  *  4/1998
JP         02001111177 A  *  4/2001

* cited by examiner

*Primary Examiner*—Mark Hellner
(74) *Attorney, Agent, or Firm*—Cha & Reiter LLC

(57) ABSTRACT

A reflective semiconductor optical amplifier includes a substrate, a waveguide with a buried heterostructure formed by sequentially laminating a lower cladding, an active layer, and an upper cladding on the substrate, the waveguide including, sequentially, respective straight line, curved and tapered waveguide regions. A current blocking layer surrounds the waveguide to prevent electric current from flowing outside the active layer. Selectively etching portions of the current blocking layer and the substrate around the waveguide forms a trench to reduce parasitic capacitance. Further features include a window region on one end of the tapered waveguide region, an anti-reflection surface on one end of the window region, and a high-reflection surface on one end of the straight line waveguide region.

20 Claims, 7 Drawing Sheets

US 7,046,435 B2

REFLECTIVE SEMICONDUCTOR OPTICAL AMPLIFIER

CLAIM OF PRIORITY

This application claims priority to an application entitled "Reflective Semiconductor Optical Amplifier," filed in the Korean Intellectual Property Office on Feb. 19, 2004 and assigned Serial No. 2004-11157, the contents of which are hereby incorporated by reference.

BACKGROUND OF THE INVENTION

1. Field of the Invention

The present invention relates to a semiconductor optical amplifier, and more particularly to a reflective semiconductor optical amplifier suitable for a wavelength-division-multiplexing passive-optical-network (hereinafter, referred to as a "WDM-PON"). The amplifier has high gain even under conditions of low operating current and low threshold current, thereby affording reduced power consumption.

2. Description of the Related Art

From among the WDM-PON light sources being considered for future ultra high speed optical subscriber networks, mode-locked Fabry-Perot lasers with incoherent lights or wavelength-seeded reflective semiconductor optical amplifiers (R-SOAs) have gained recognition, because one of them can be shared by various subscribers and they can be manufactured inexpensively. Yet, the output of the mode-locked Fabry-Perot laser diode (FP-LD) may be unstable, because its locking characteristics become deteriorated when temperature or environmental change modifies the wavelength of oscillation mode. Since the reflective semiconductor optical amplifiers, by contrast, simply amplify and modulate incoherent light assigned to each subscriber, their output power does not change much even though spectrum changes slightly due to external conditions, and relative intensity noise due to gain saturation characteristic is reduced. Accordingly, research has been actively pursued into utilization of the reflective semiconductor optical amplifier.

However, since general semiconductor optical amplifiers have driving current and threshold current higher than those of FP-LDs, the semiconductor optical amplifiers consume a large amount of power. In addition, since the semiconductor optical amplifiers have long length and do not oscillate, they have they exhibit an unfavorable high frequency response characteristic. Reflective semiconductor optical amplifiers having general structures are therefore unsuitable as light sources by which to amplify, modulate, and transmit signals in the WDM-PONs.

SUMMARY OF THE INVENTION

The present invention has been made to solve the above-mentioned problems occurring in the prior art and provides additional advantages, by providing a reflective semiconductor optical amplifier, having high gain even under conditions of low operating current and reduced power consumption due to low threshold current, for use as a light source for amplifying, modulating, and transmitting signals in a WDM-PON.

Another aspect of the present invention is to provide a reflective semiconductor optical amplifier having superior high frequency response characteristic.

In one embodiment, there is provided a reflective semiconductor optical amplifier that includes a substrate, an optical waveguide with a buried heterostructure formed by sequentially laminating a lower cladding, an active layer, and an upper cladding on the substrate, the heterostructure including a straight line waveguide region, a curved waveguide region, and a tapered waveguide region; a current blocking layer formed around the optical waveguide to prevent electric current from flowing to a region other than the active layer of the optical waveguide. A trench is formed by selectively etching portions of the current blocking layer and the substrate around the optical waveguide in order to reduce parasitic capacitance due to electric current leaked around the active layer. A window region formed on one end of the tapered waveguide region, and an anti-reflection surface formed on one end of the window region. A high-reflection surface formed on one end of the straight line waveguide region to reflect inputted light.

Preferably, in the present invention, the active layer is formed in a structure having eight pairs to ten pairs of multi quantum wells.

It is also preferred that the optical waveguide include a straight line waveguide region having a length of 400 µm to 900 µm, a curved waveguide region having a length of 100 µm, and a tapered waveguide region having a length of 180 µm.

It is also preferable that the tapered waveguide region be curved with an angle of 7 to 10° with respect to a direction perpendicular to the anti-reflection surface.

More preferably, the present invention further includes an ohmic contact layer formed on the upper cladding, a passivation layer formed on an entire surface of a trench structure excepting the ohmic contact layer, an upper electrode formed on at least the ohmic contact layer, and a lower electrode formed on a surface of the substrate opposite the current blocking layer.

BRIEF DESCRIPTION OF THE DRAWINGS

The above features and advantages of the present invention will be more apparent from the following detailed description taken in conjunction with the accompanying drawings, in which the same reference numerals are used to designate the same elements throughout the several views.

DETAILED DESCRIPTION

An embodiment according to the present invention is described below with reference to the accompanying drawings, with detailed description of known functions and configurations being omitted for clarity and simplicity of presentation.

Figure 1:
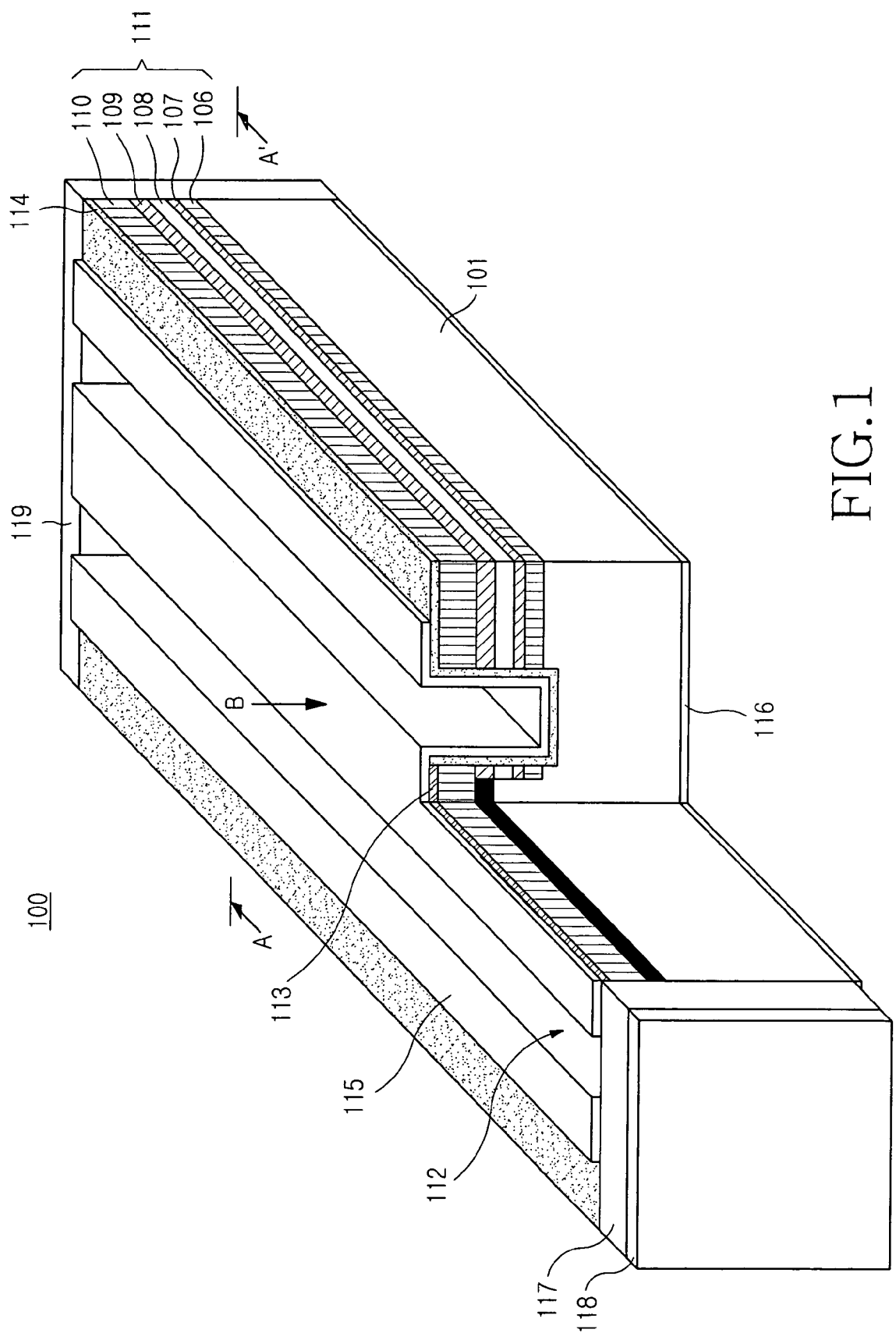
FIG. 1 is a perspective view of a reflective semiconductor optical amplifier according to one preferred embodiment of the present invention.
Figure 2:
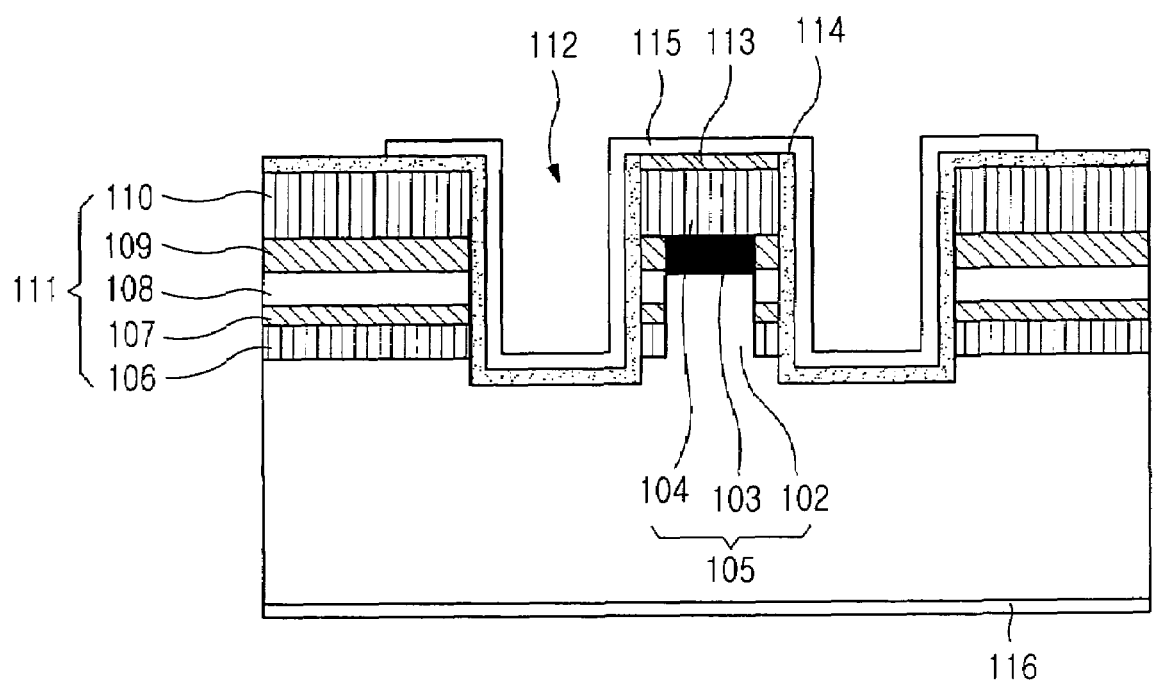
FIG. 2 is a sectional view taken along line A–A' in FIG. 1.

FIG. 1 is a perspective view showing, by way of illustrative and non-limitative example, a reflective semiconductor optical amplifier according to one embodiment of the present invention, and FIG. 2 is a sectional view taken along line A–A' in FIG. 1. In FIGS. 1 and 2, thickness, width, and length of composition material layers are inexactly drawn, and do not show actual size or proportional sizes of these material layers.

Referring to FIGS. 1 and 2, the reflective semiconductor optical amplifier 100 according to the present invention includes a substrate 101, an optical waveguide 105, a current blocking layer 111, a trench 112, an ohmic contact layer 113, a passivation layer 114, an upper electrode 115, a lower electrode 116, a window region 117, an anti-reflection surface (AR) 118, and a high-reflection surface (HR) 119. The optical waveguide 105 includes a lower cladding 102, an active layer 103, and an upper cladding 104.

The substrate 101 is a compound semiconductor substrate such as an n-InP substrate.

The optical waveguide 105 is formed by sequentially laminating the lower cladding 102, the active layer 103, and the upper cladding 104. The active layer 103 is formed in a buried hetero-structure (BH) on the n-InP substrate 101, and is formed in a structure, such as one having eight pairs of multi quantum wells (MQWs), in order to obtain high gain even under conditions of low electric current. In a general semiconductor laser, when electric current is applied to an upper electrode and an electric field is formed, electrons and holes shift to an active layer in a semiconductor substrate, and the electrons are recombined with the holes. Therefore, light generates in the active layer.

Figure 3:
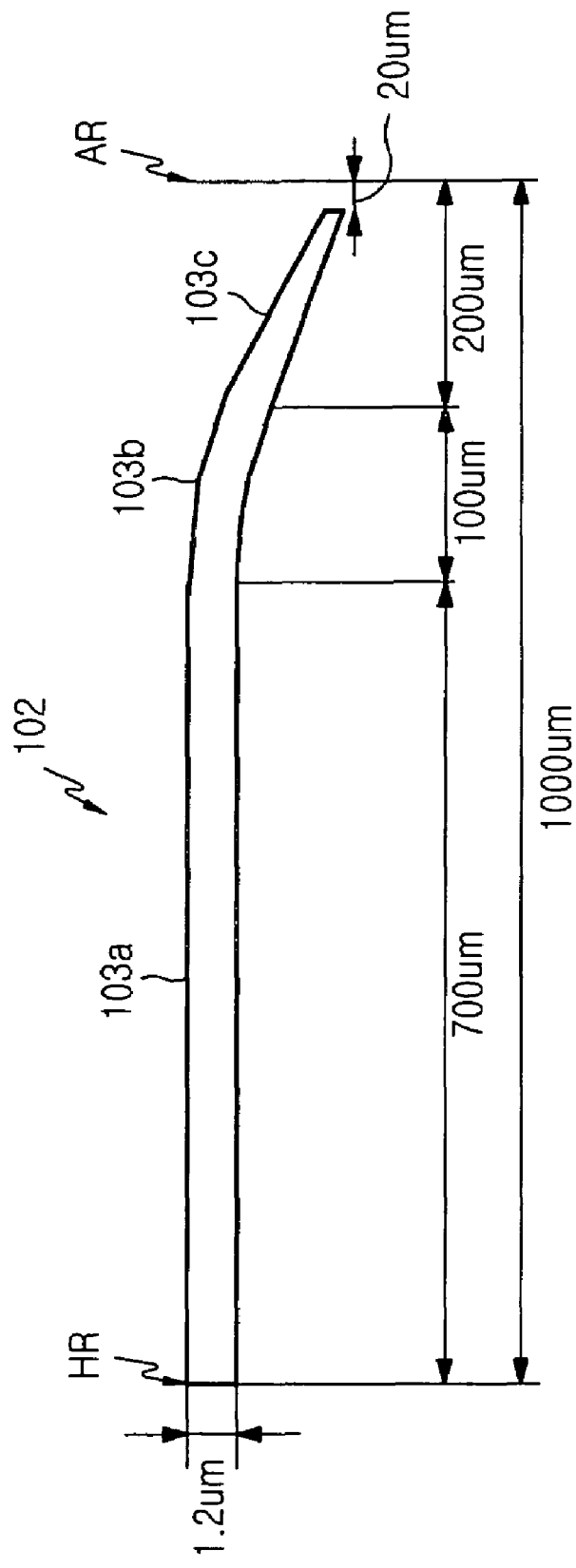
FIG. 3 is a view showing a structure of an active layer according to the present invention.

FIG. 3 is a view showing a structure of the optical waveguide 105, especially, the active layer 103 according to the present invention. FIG. 3 is a sectional view in a B direction of FIG. 1, where HR stands for high-reflection surface 119 and AR stands for anti-reflection surface 118. As represented in FIG. 3, the optical waveguide 105 includes three regions: a straight line waveguide region 103a, a curved waveguide region 103b, and a tapered waveguide region 103c. The straight line waveguide region 103a is perpendicular to the high-reflection surface in order to create a high reflection factor in the high-reflection surface. In the straight line waveguide region 103a, the active layer 103 has a width of about 1.2 µm and a length of about 700 µm. The curving of the curved waveguide region 103b reduces reflection factor in an incidence/exit surface, and induces light to be curved with an angle of about 10° along its progressing direction. Herein, a curvature radius of the waveguide for deflecting the light by as much as 10° is 576 µm, in which case, the waveguide has a length of about 100 µm. In the present embodiment, in order to reduce ripple, 10° is selected as the angle for the curvature of the waveguide. The larger the angle by which the waveguide curves, the lower the reflection factor at the incidence/exit surface. Although a low reflection factor is advantageous, since loss in the curved waveguide region 103b is large, gain is reduced. The gain reduction is compensated, however, by manufacturing the active layer in a multi quantum well structure. In the tapered waveguide region 103c, the width of the active layer is reduced from 1.2 µm to 0.4 µm, so that mode size can change. A window region W having a length of 20 µm is disposed between one end of the waveguide and the incidence/exit surface AR, so that the reflection factor in the incidence/exit surface becomes more reduced. The tapered waveguide region 103c is designed to have a length of about 200 µm including the window region W. The width of the waveguide has an important influence on characteristics of the amplifier. Generally, as the width of the waveguide grows narrower, threshold current is reduced and gain increases. However, when the width of the waveguide is excessively narrow, a light confinement coefficient is lowered, thereby lowering gain.

Referring to FIGS. 1 and 2 again, the current blocking layer 111 is formed around the active layer 103 having the buried hetero-structure to prevent electric current from flowing to a region other than the active layer 103. Further, the current blocking layer 111 is formed by laminating a p-InP layer 106, an n-InP layer 107, an i-InP layer 108, an n-InP layer 109, and a p-InP layer 110 on the substrate 101.

The trench 112 is for reducing parasitic capacitance of a chip and is formed by selectively etching portions of the current blocking layer 111 and the substrate 101. The total chip length of a reflective semiconductor optical amplifier is an important factor having an influence on characteristics of an amplifier and a modulator. Moreover, since gain is proportional to the length of a chip, as the length of the chip grows longer, the gain increases. However, as the length of the chip grows longer, parasitic capacitance increases, thereby deteriorating a high frequency modulation characteristic. Generally, since a reflective semiconductor optical amplifier has a chip length of about 1000 µm, has a length longer than that of a laser diode (LD), and does not perform a lasing, it has a bad high frequency response characteristic. Accordingly, in the present invention, a deep trench is formed around an active layer to reduce parasitic capacitance that might otherwise occur due to electric current leaked around the active layer.

The ohmic contact layer 113 is formed between the p-InP upper cladding 104 on the active layer 103 and the upper electrode 115. In a general semiconductor laser, in order to achieve positive electrode and low resistance at p-side, a thin ohmic contact layer with which a great amount of p-type dopant is doped is formed below the electrode, so that ohmic contact is achieved between the positive electrode and the ohmic contact layer.

The passivation layer 114 is formed on an entire upper surface of the overall structure, excepting the ohmic contact layer 113, to protect the chip and is made from $SiO_2$.

The upper electrode 115 is partly formed on the ohmic contact layer 113 and the passivation layer 114, and the lower electrode 116 is formed on a surface of the substrate 101 opposite the current blocking layer 111.

The window region 117 having a length of 20 µm is formed between one end of a tapered waveguide of the active layer 103 and the incidence/exit surface AR so as to diverge light outputted from the active layer 103. The window region 117 thereby prevents light progressing in the reverse direction from having a bad influence on the reflective semiconductor optical amplifier 100. Also, the window region 117 allows a more reduced reflection factor to be obtained. Such a window region 117 is formed through re-growth of material the same as that of the substrate 101.

The anti-reflection surface 118 is coated on the incidence/exit surface to, together with the window region 117, minimize reflected light.

The high-reflection surface 119 is coated on the opposite end of the reflective semiconductor optical amplifier 100 to reflect all light incident to the coated surface, thereby forming a single input/output structure in which the light incident to the coated surface is reflected back to emerge from the incidence surface.

Figure 4:
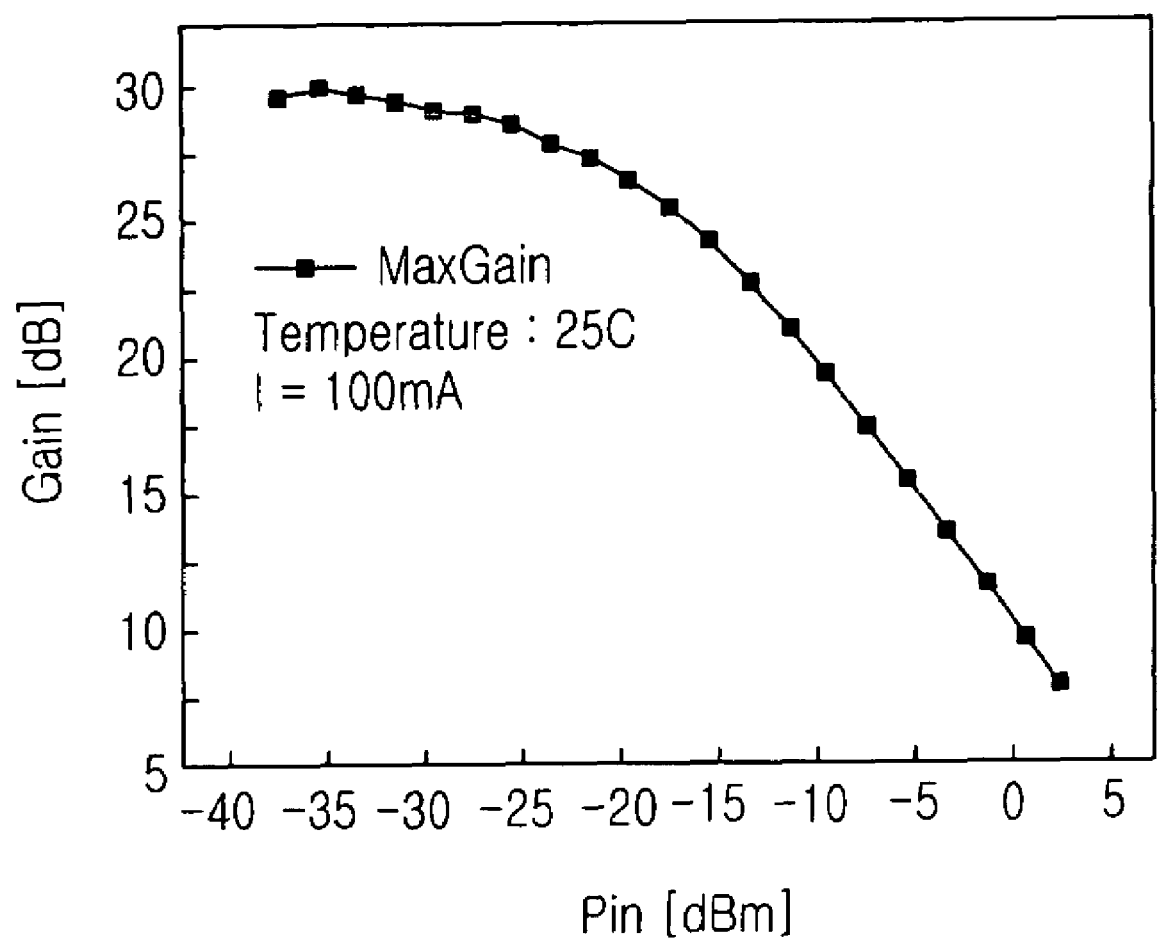
FIG. 4 is a view showing a gain property of a reflective semiconductor optical amplifier according to the present invention.
Figure 5:
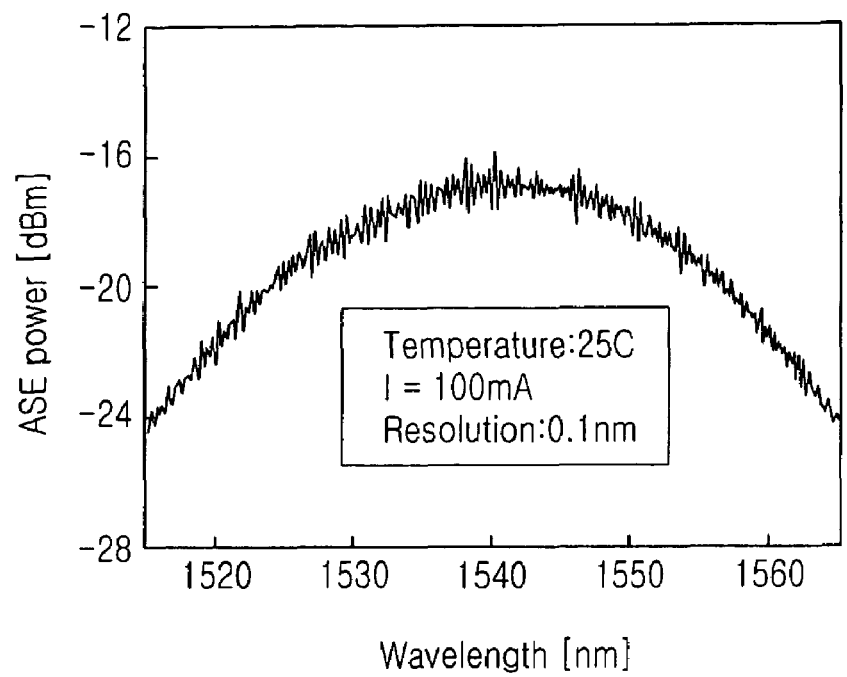
FIG. 5 is a view showing a gain spectrum of a reflective semiconductor optical amplifier according to the present invention.
Figure 6:
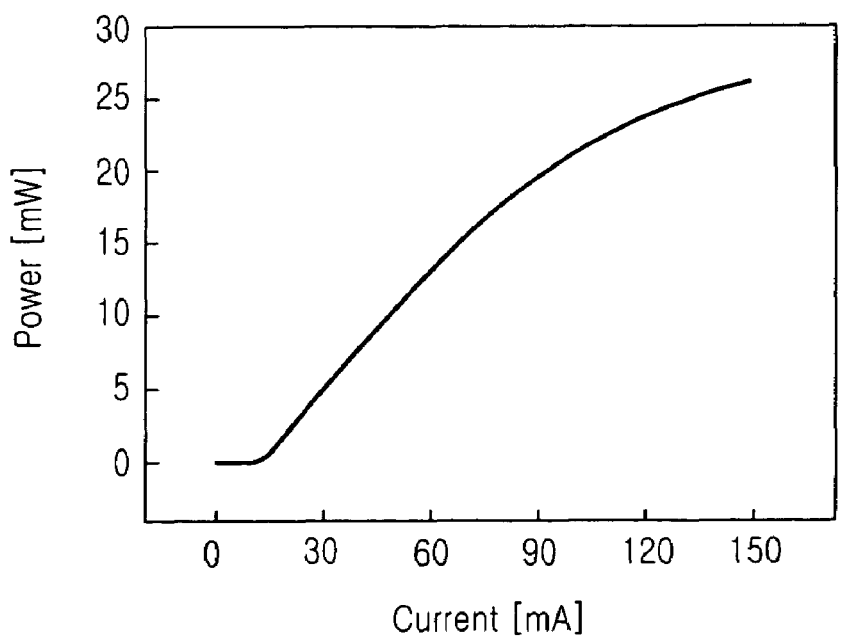
FIG. 6 is a view showing a characteristic of power of light with respect electric current in a reflective semiconductor optical amplifier according to the present invention.

FIGS. 4 to 6 are graphs showing characteristics of a reflective semiconductor optical amplifier according to the present invention. FIG. 4 shows a gain curve, FIG. 5 shows a gain spectrum, and FIG. 6 shows a characteristic of power of light with respect to electric current.

Referring to FIGS. 4 to 6, the reflective semiconductor optical amplifier according to the present invention has a gain of about 30 decibels (dB), ripple of about 1.9 dB, and threshold current $I_{th}$ of about 16 milliamps (mA). Accordingly, the threshold current is small, and the gain is large. In addition, the ripple is greatly reduced in comparison with the high gain.

Figure 7A:
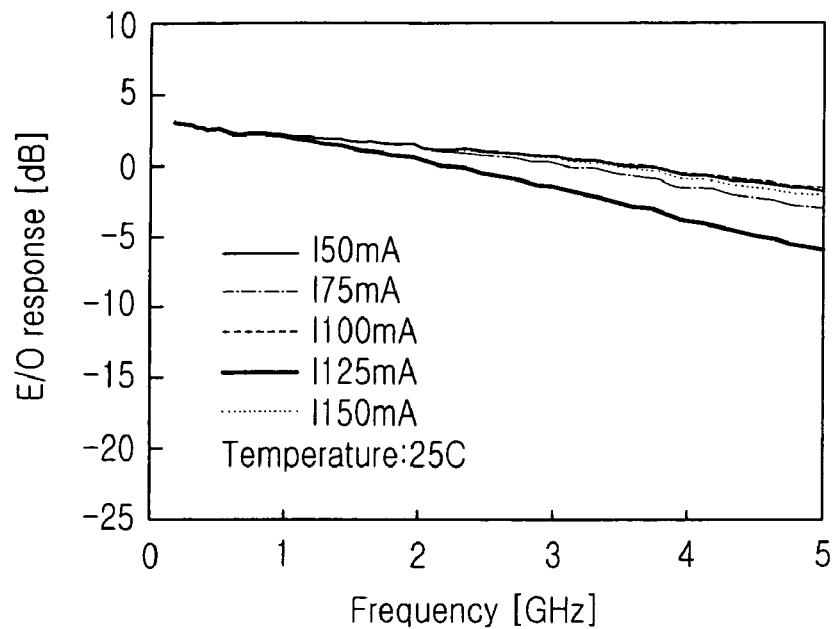
FIG. 7 is a graph showing comparison between a high frequency response characteristic of a reflective semiconductor optical amplifier according to the present invention and that of a conventional reflective semiconductor optical amplifier.
Figure 7B:
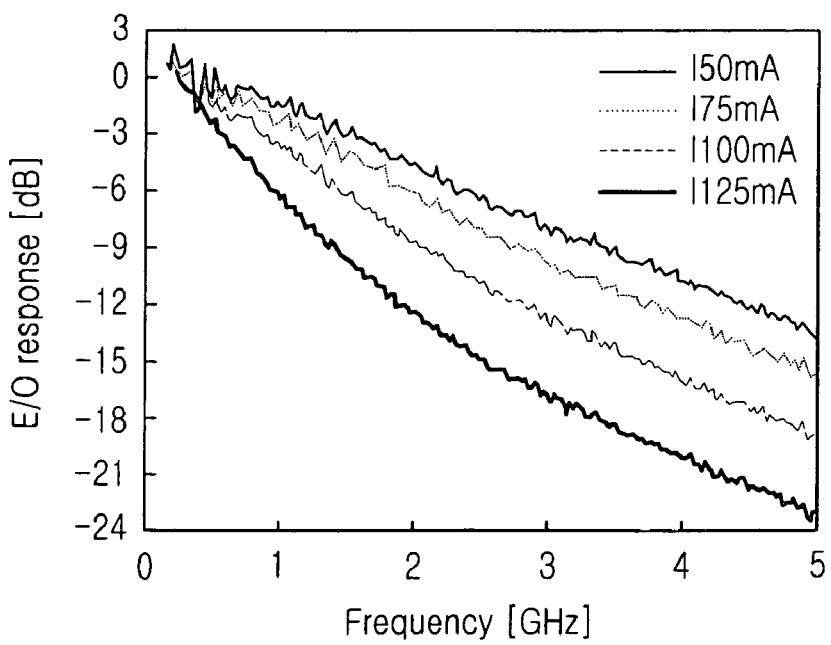

FIG. 7 is a graph showing comparison between high frequency response characteristic of a reflective semiconductor optical amplifier according to the present invention and that of a conventional reflective semiconductor optical amplifier. FIG. 7a is a graph showing the high frequency response characteristic of the reflective semiconductor optical amplifier according to the present invention, which has a chip length of 1000 μm and has a trench. FIG. 7b is a graph showing the high frequency response characteristic of the conventional reflective semiconductor optical amplifier, which has a chip length of 500 μm and has no trench.

Referring to FIG. 7a, a 3 dB bandwidth is about 3.5 GHz. In contrast, referring to FIG. 7b, a 3 dB bandwidth is about 1.25 GHz. In particular, due to the formation of a trench, the high frequency response characteristic is improved despite the increased chip length.

Figure 8A:
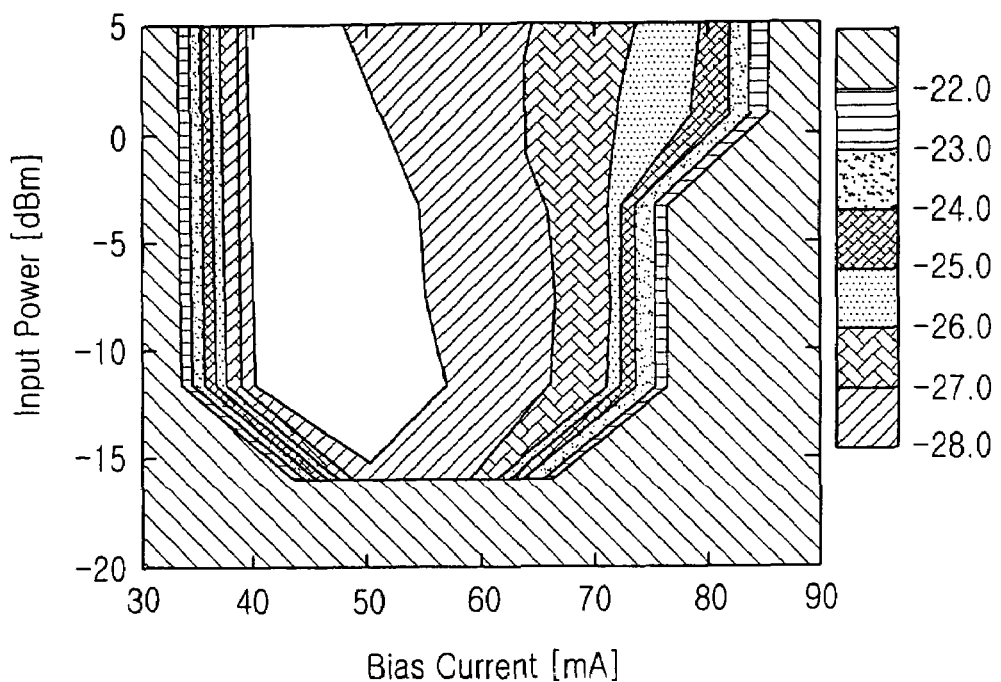
FIGS. 8A and 8B are graphs showing comparison between a transmission characteristic of a reflective semi-
Figure 8B:
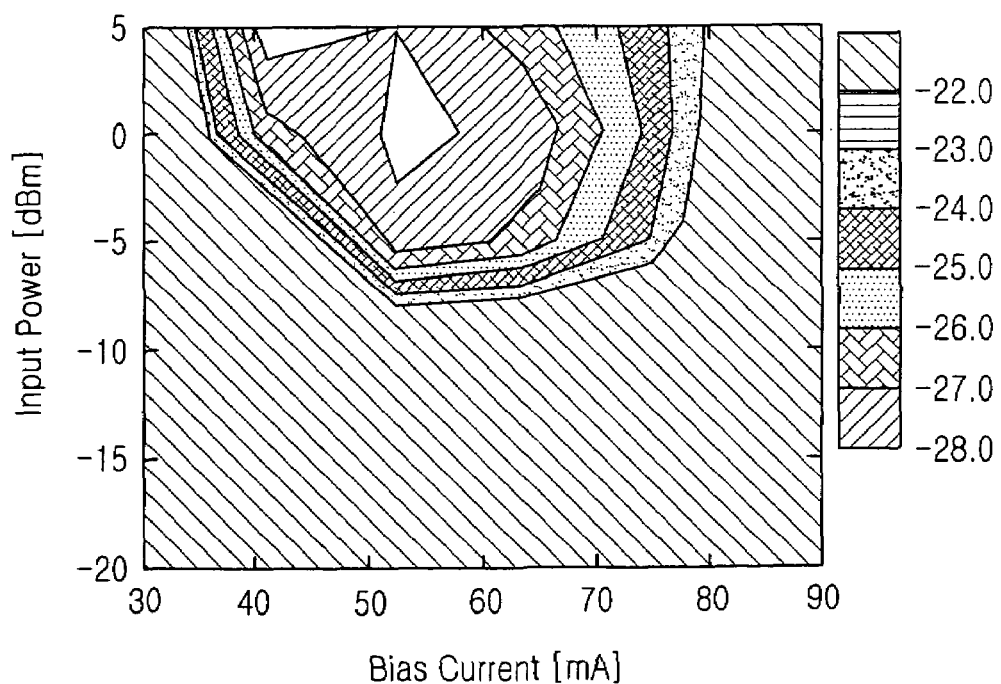

FIGS. 8A, 8B are graphs that compare transmission experiment results using the respective reflective semiconductor optical amplifiers compared in FIG. 7. Referring to FIGS. 8A, 8B, bit error rates (BERs) are measured after light has been transmitted over a distance of 25 kilometers (km) through a single mode fiber at a speed of 1.25 gigabits per second (Gbps). The reflective semiconductor optical amplifier (FIG. 8A) according to the present invention operates even under conditions wherein the operating current and power of injected light are much smaller than those of the conventional reflective semiconductor optical amplifier (FIG. 8B).

As described above, according to the present invention, the structure of an active layer constituting a reflective semiconductor optical amplifier is optimized and a trench is formed, so that gain is large even under conditions of low operating current. In addition, since threshold current is small, power consumption is reduced. Furthermore, the reflective semiconductor optical amplifier can operate even at more than 1.25 GHz. Accordingly, when the reflective semiconductor optical amplifier is used as a subscriber light source together with an exterior incoherent light source in a WDM-PON, the reflective semiconductor optical amplifier has a stable operation, in comparison with a FP-LD, the latter having a bad wavelength-locking characteristic due to temperature change. The present inventive reflective semiconductor optical amplifier has, moreover, a high frequency response characteristic and a power consumption level similar to that of the FP-LD.

Additionally, according to the present invention, relative intensity noise can be eliminated by the natural saturation characteristic of a semiconductor optical amplifier.

Also, since a reflective semiconductor optical amplifier, such as that of the present invention, can amplify a signal and simultaneously modulate the amplified signal, it can also amplify and modulate a weak signal, and transmit the modulated signal. As an added benefit, two functions can be performed by one device, thereby lowering cost.

While the invention has been shown and described with reference to a preferred embodiment, it will be understood by those skilled in the art that various changes in form and details may be made therein without departing from the spirit and scope of the invention as defined by the appended claims.

What is claimed is:

1. A reflective semiconductor optical amplifier comprising:
   a substrate;
   an optical waveguide with a buried heterostructure formed by sequentially laminating a lower cladding, an active layer, and an upper cladding on the substrate, and including a straight line waveguide region having an end, a curved waveguide region, and a tapered waveguide region having an end;
   a current blocking layer formed around the optical waveguide to prevent electric current from flowing to a region other than the active layer of the optical waveguide;
   a trench formed by selectively etching portions of the current blocking layer and the substrate around the optical waveguide in order to reduce parasitic capacitance due to electric current leaked around the active layer;
   a window region formed on the end of the tapered waveguide region, the window region having an end;
   an anti-reflection surface formed on the end of the window region; and
   a high-reflection surface formed on the end of the straight line waveguide region to reflect inputted light.

2. The reflective semiconductor optical amplifier as claimed in claim 1, wherein the active layer is formed in a structure having eight pairs to ten pairs of multi quantum wells.

3. The reflective semiconductor optical amplifier as claimed in claim 1, wherein the straight line waveguide region has a length of approximately 400 μm to 900 μm, the curved waveguide region has a length of approximately 100 μm, and the tapered waveguide region has a length of approximately 180 μm.

4. The reflective semiconductor optical amplifier as claimed in claim 3, wherein the tapered waveguide region is curved with an angle of approximately 7 to 10° with respect to a direction perpendicular to the anti-reflection surface.

5. The reflective semiconductor optical amplifier as claimed in claim 1, wherein the curved waveguide region is continuously joined to both the straight waveguide region and the tapered waveguide region.

6. The reflective semiconductor optical amplifier as claimed in claim 3, wherein the window region is formed to have a width of approximately 15 to 25 μm.

7. The reflective semiconductor optical amplifier as claimed in claim 1, wherein the tapered waveguide region is curved with an angle of approximately 7 to 10° with respect to a direction perpendicular to the anti-reflection surface.

8. The reflective semiconductor optical amplifier as claimed in claim 7, wherein the window region is configured to diverge light outputted from the active layer.

9. The reflective semiconductor optical amplifier as claimed in claim 1, wherein the window region is configured to diverge light outputted from the active layer.

10. The reflective semiconductor optical amplifier as claimed in claim 7, wherein the curved waveguide region is continuously joined to both the straight waveguide region and the tapered waveguide region.

11. The reflective semiconductor optical amplifier as claimed in claim 1, further comprising:
an ohmic contact layer formed on the upper cladding;
a passivation layer formed on an entire surface of a trench structure excepting the ohmic contact layer;
an upper electrode formed on at least the ohmic contact layer; and
a lower electrode formed on a surface of the substrate opposite the current blocking layer.

12. The reflective semiconductor optical amplifier as claimed in claim 1, wherein the current blocking layer is formed by laminating a p-InP layer, an n-InP layer, an i-InP layer, an n-InP layer, and a p-InP layer on the substrate.

13. The reflective semiconductor optical amplifier as claimed in claim 1, wherein the lengths of the straight, curved and tapered waveguide regions total, as measured along a single straight line, to between approximately 1 and 1.2 millimeters.

14. The reflective semiconductor optical amplifier as claimed in claim 13, wherein a length of the window region is approximately 20 µm.

15. The reflective semiconductor optical amplifier as claimed in claim 1, wherein a length of the window region is approximately 20 µm.

16. The reflective semiconductor optical amplifier as claimed in claim 1, further comprising a trench formed by selectively etching portions of the current blocking layer and the substrate around the optical waveguide in order to reduce parasitic capacitance due to electric current leaked around the active layer.

17. A reflective semiconductor optical amplifier having two ends, the amplifier comprising:
a substrate;
an optical waveguide with a buried heterostructure formed by sequentially laminating a lower cladding, an active layer, and an upper cladding on the substrate, and including a straight line waveguide region, a curved waveguide region, and a tapered waveguide region;
a current blocking layer formed around the optical waveguide to prevent electric current from flowing to a region other than the active layer of the optical waveguide;
a trench formed by selectively etching portions of the current blocking layer and the substrate around the optical waveguide in order to reduce parasitic capacitance due to electric current leaked around the active layer;
an anti-reflection surface formed on one of said two ends;
a high-reflection surface formed on the other of said two ends to reflect inputted light; and
a region of light-diverging material formed between the anti-reflection surface and the active layer.

18. The reflective semiconductor optical amplifier as claimed in claim 17, wherein the active layer is formed in a structure having eight pairs to ten pairs of multi quantum wells.

19. The reflective semiconductor optical amplifier as claimed in claim 17, wherein the straight line waveguide region has a length of approximately 400 µm to 900 µm, the curved waveguide region has a length of approximately 100 µm, and the tapered waveguide region has a length of approximately 180 µm.

20. A method for fabricating a reflective semiconductor optical amplifier having two ends comprising the steps of:
providing a substrate;
sequentially laminating onto the substrate a lower cladding, an active layer, and an upper cladding to create a straight line waveguide region, a curved waveguide region, and a tapered waveguide region;
forming a current blocking layer around the optical waveguide to prevent electric current from flowing to a region other than the active layer of the optical waveguide;
forming a trench by selectively etching portions of the current blocking layer and the substrate around the optical waveguide in order to reduce parasitic capacitance due to electric current leaked around the active layer;
forming an anti-reflection surface on one of said two ends;
forming a high-reflection surface on the other of said two ends to reflect inputted light; and
forming a region of light-diverging material between the anti-reflection surface and the active layer.

* * * * *